(12) United States Patent
Baidas et al.

(10) Patent No.: US 9,479,182 B1
(45) Date of Patent: Oct. 25, 2016

(54) METHODS AND APPARATUS FOR SYNCHRONIZING OPERATIONS USING SEPARATE ASYNCHRONOUS SIGNALS

(71) Applicant: Integrated Device Technology, Inc., San Jose, CA (US)

(72) Inventors: Zaher Baidas, Kanata (CA); Bogdan Staicu, Ottawa (CA); Menno Tjeerd Spijker, Ottawa (CA)

(73) Assignee: INTEGRATED DEVICE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 14/975,388

(22) Filed: Dec. 18, 2015

Related U.S. Application Data

(63) Continuation-in-part of application No. 14/975,226, filed on Dec. 18, 2015.

(60) Provisional application No. 62/188,197, filed on Jul. 2, 2015.

(51) Int. Cl.
*H03L 7/08* (2006.01)
*H03L 7/083* (2006.01)

(52) U.S. Cl.
CPC ............. *H03L 7/0805* (2013.01); *H03L 7/083* (2013.01)

(58) Field of Classification Search
CPC ......... H03L 7/00; H03L 7/08; H03L 7/0805; H03L 7/083; H03L 7/16; H03L 7/20; H03L 2207/50; H04L 7/00; H04L 7/0012; H04L 7/0079; H04L 7/0083; H04L 7/0087; H04L 7/0091; H04L 7/02; H04L 7/027; H04L 7/0274; H04L 7/0033; H04L 7/00331

USPC ....... 375/328, 354, 356, 360, 362, 364, 376; 370/350, 509, 510
See application file for complete search history.

(56) References Cited

U.S. PATENT DOCUMENTS

| | | | | |
|---|---|---|---|---|
| 5,502,711 A | * | 3/1996 | Clark | ........................ H03L 7/07 360/51 |
| 7,227,476 B1 | | 6/2007 | Wong | |
| 8,285,884 B1 | | 10/2012 | Norrie | |
| 8,362,819 B1 | | 1/2013 | Kris | |
| 2003/0093702 A1 | * | 5/2003 | Luo | ........................... G06F 1/32 713/320 |
| 2006/0001494 A1 | * | 1/2006 | Garlepp | .................... H03L 7/23 331/2 |
| 2010/0330931 A1 | * | 12/2010 | Uehara | .................... G01S 19/23 455/75 |
| 2012/0314738 A1 | | 12/2012 | Kashima et al. | |
| 2013/0169173 A1 | | 7/2013 | Chen et al. | |
| 2015/0263849 A1 | * | 9/2015 | Terao | ...................... H04L 25/14 375/362 |
| 2015/0286606 A1 | | 10/2015 | Sengoku | |

* cited by examiner

*Primary Examiner* — Young T Tse
(74) *Attorney, Agent, or Firm* — Myers Bigel & Sibley P.A.

(57) ABSTRACT

A method of synchronizing operations between integrated circuits can include transmitting a first clock signal from a first transmitter associated with a first integrated circuit of a first system, to a receiver associated with a second integrated circuit of a second system, receiving a second clock signal from a second transmitter associated with a third integrated circuit of the second system, receiving at the first system a first phase difference determined by the second system, wherein the first phase difference is determined between the first clock signal at the second system and the second clock signal at the second system, determining a second phase difference at the first system, wherein the second phase difference is determined between the first clock signal at the first system and the second clock signal at the first system, and determining a difference between the first phase difference and the second phase difference.

20 Claims, 9 Drawing Sheets

METHODS AND APPARATUS FOR SYNCHRONIZING OPERATIONS USING SEPARATE ASYNCHRONOUS SIGNALS

CROSS-REFERENCE TO RELATED APPLICATIONS

This application is a continuation-in-part of U.S. patent application Ser. No. 14/975,226, filed Dec. 18, 2015, entitled Methods and Apparatus for Transmitting Data Over a Clock Signal which is assigned to the assignee of the present invention, the disclosure of which is hereby incorporated herein by reference in its entirety as if set forth fully herein.

The present application also claims priority under 35 U.S.C. §119 to U.S. Provisional Application Ser. No. 62/188,197, filed Jul. 2, 2015, entitled Multi-channel Timing Controllers That Provide Fine Phase Adjustment in Multi-PLL Timing Devices, the disclosure of which is incorporated herein in its entirety as if set forth fully herein.

FIELD OF THE INVENTION

The present inventive concepts relate to methods, systems and integrated circuits for clock distribution for synchronization.

BACKGROUND

Circuits and systems operating simultaneously can share a reference signal that establishes a common time signal with which operations can be coordinated. One method with which this can be accomplished is with a clock signal that repeats at a given frequency and oscillates between a high and a low state.

Systems connected to the clock signal can synchronize their operations to the clock signal transitions. These synchronized operations can be used in signal processing, data transmission, and/or other types of time-sensitive data operations.

As a clock signal is shared across physical distances, the characteristics of the transmission medium as well as the distance itself can introduce skew into the clock signal as it is perceived by those elements of the system receiving the signal.

For example, clock signals can be implemented across the backplane of a communication system. A "master" clock can generate a master clock signal which is distributed to other elements of the system receiving the clock. These other elements may be timing cards or other types of integrated circuits. Because these signals may experience skew over the transmission distance, the system can provide other time synchronization elements to ensure that the elements receiving the clock signal are correctly synchronized.

One such time synchronization element is a Pulse Per Second (PPS) signal. In traditional systems a PPS signal may have a width of less than one second that repeats once per second. Because the PPS signal specifies a periodic designation of a second and not the actual time, it can be combined with other time source data that provides the full date and time to accurately establish the current time.

Traditionally a clock signal may be transmitted on a backplane of a communication system between cards for synchronization purposes.

SUMMARY

Aspects of the present inventive concepts may provide methods and circuits capable of synchronizing operations between one or more systems using separate asynchronous periodic reference signals shared between the systems.

According to example embodiments of the present inventive concepts, a method of synchronizing operations between integrated circuits may include transmitting a first periodic reference signal from a first transmitter associated with a first integrated circuit of a first system, to a receiver associated with a second integrated circuit of a second system, receiving a second periodic reference signal from a second transmitter associated with a third integrated circuit of the second system, receiving at the first system a first phase difference determined by the second system, determining a second phase difference at the first system, and determining a difference between the first phase difference and the second phase difference. The first phase difference may be determined between the first periodic reference signal at the second system and the second periodic reference signal at the second system. The second phase difference may be determined between the first periodic reference signal at the first system and the second periodic reference signal at the first system.

In some embodiments, the method may further include transmitting a first phase marker associated with a first clock signal as the first periodic reference signal from the first transmitter to the receiver, and receiving a second phase marker associated with a second clock signal as the second periodic reference signal from the second transmitter. The first phase marker may be configured to be used by the second system to adjust an output of the second integrated circuit to be time-aligned with the first phase marker. The second phase marker may be configured to be used by the first system to adjust an output of the fourth integrated circuit to be time-aligned with the second phase marker.

In some embodiments, the first integrated circuit may be a first digital phase-locked loop (DPLL), the second integrated circuit may be a second DPLL, the third integrated circuit may be a third DPLL, and the fourth integrated circuit may be a fourth DPLL.

In some embodiments, transmitting the first phase marker associated with the first clock signal may include transmitting the first phase marker as a first data transmission within the first clock signal.

In some embodiments, the first data transmission within the first clock signal may be transmitted by pulse width modulating the first clock signal without altering the frequency of a first repeating edge of the first clock signal.

In some embodiments, receiving at the first system a first phase difference determined by the second system may include receiving the first phase difference as a second data transmission within the second clock signal.

In some embodiments, the second data transmission within the second clock signal may be received by decoding a pulse width modulation of the second clock signal. The frequency of a second repeating edge of the second clock signal may be constant.

In some embodiments, the first periodic reference signal may be a first clock signal with a first frequency, and the second periodic reference signal may be a second clock signal with a second frequency different from the first frequency.

In some embodiments, the method may further include determining a transmission delay between the first system and the second system based on the difference between the first phase difference and the second phase difference.

In some embodiments, the method may further include transmitting the transmission delay to the receiver.

According to example embodiments of the present inventive concepts, an integrated circuit may include a first phase-locked loop (PLL), a second PLL, a transmitter associated with the first PLL and configured to transmit a first periodic reference signal to a second system, a receiver associated with the second PLL and configured to receive a second periodic reference signal from the second system, and a processing circuit. The processing circuit may perform operations including transmitting the first periodic reference signal from the transmitter to the second system, receiving the second periodic reference signal at the receiver, receiving at the receiver a first phase difference determined by the second system between the first periodic reference signal at the second system and the second periodic reference signal at the second system, determining a second phase difference between the first periodic reference signal at the first system and the second periodic reference signal at the first system, and determining a difference between the first phase difference and the second phase difference.

In some embodiments, the processing circuit may be further configured to perform operations including transmitting a first phase marker associated with a first clock signal as the first periodic reference signal to the second system from the transmitter, and receiving a second phase marker associated with a second clock signal as the second periodic reference signal from a fourth PLL of the second system at the receiver. The first phase marker may be configured to be used by the second system to adjust an output of a third PLL to be time-aligned with the first phase marker. The second phase marker may be configured to be used by the processor to adjust the output of the second PLL to be time-aligned with the second phase marker.

In some embodiments, transmitting a first phase marker associated with a first clock signal may include transmitting the first phase marker as a first data transmission within the first clock signal.

In some embodiments, the first data transmission within the first clock signal is transmitted by pulse width modulating the first clock signal without altering the frequency of a first repeating leading edge of the first clock signal.

In some embodiments, receiving at the receiver a first phase difference may include receiving the first phase difference as a second data transmission within the second clock signal.

In some embodiments, the second data transmission within the second clock signal may be received by decoding a pulse width modulation of the second clock signal, and the frequency of a second repeating leading edge of the second clock signal may be constant.

In some embodiments, the processing circuit may be further configured to perform operations including determining a transmission delay between the first system and the second system based on the difference between the first phase difference and the second phase difference.

In some embodiments, the processing circuit may be further configured to perform operations including transmitting the transmission delay to the second system.

According to example embodiments of the present inventive concepts, an integrated circuit may include a first phase-locked loop PLL, a second PLL, a receiver associated with the first PLL and configured to receive a first periodic reference signal from a second system, a transmitter associated with the second PLL and configured to transmit a second periodic reference signal to the second system, and a processing circuit. The processing circuit may be configured to perform operations including receiving the first periodic reference signal at the receiver, transmitting the second periodic reference signal from the transmitter to the second system, determining a first phase difference between the first periodic reference signal at the receiver and the second periodic reference signal at the transmitter, transmitting the first phase difference to the second system, and receiving a transmission delay calculation at the receiver from the second system.

In some embodiments, the first periodic reference signal may be a first clock signal and the second periodic reference signal may be a second clock signal.

In some embodiments, the processing circuit may be further configured to perform operations including receiving a first phase marker associated with a first clock signal as the first periodic reference signal at the receiver, and transmitting a second phase marker associated with a second clock signal as the second periodic reference signal from the transmitter to the second system. The first phase marker may be configured to be used to adjust the output of the first PLL to be time-aligned with the first phase marker. The second phase marker may be configured to be used by the second system to adjust the output of a third PLL to be time-aligned with the second phase marker.

In some embodiments, receiving a first phase marker associated with a first clock signal may include receiving the first phase marker as a first data transmission within the second clock signal.

In some embodiments, the first data transmission within the first clock signal may be received by decoding a pulse width modulation of the first clock signal. The frequency of a first repeating leading edge of the first clock signal may be constant.

In some embodiments, transmitting the first phase difference to the second system may include transmitting the first phase difference as a second data transmission within the second clock signal.

In some embodiments, the second data transmission within the second clock signal may be transmitted by pulse width modulating the second clock signal without altering the frequency of a second repeating leading edge of the second clock signal.

In some embodiments, receiving the transmission delay determination at the receiver from the second system may include receiving the transmission delay determination as a third data transmission within the first clock signal.

BRIEF DESCRIPTION OF THE DRAWINGS

The accompanying drawings, which are incorporated in and constitute a part of the specification, illustrate embodiments of the inventive concepts and, together with the description, serve to explain principles of the inventive concepts. Like numbers refer to like elements throughout the illustrations.

DETAILED DESCRIPTION

Figure 1:
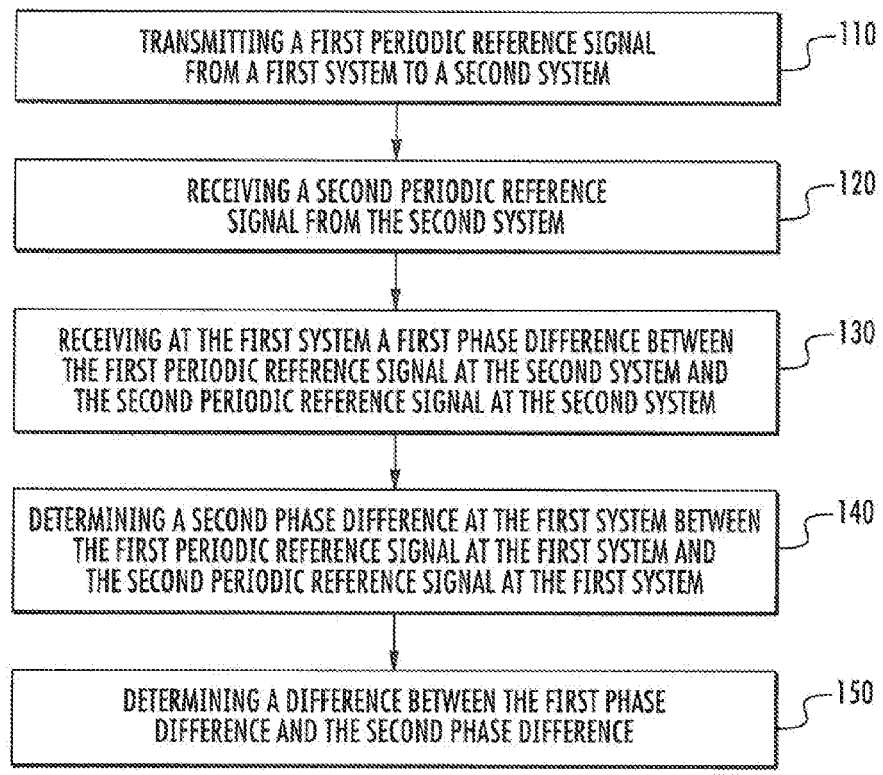
FIG. 1 is a flowchart illustrating operations of a method for synchronizing operations between integrated circuits according to some embodiments of the present inventive concepts.

The present inventive concepts now will be described hereinafter with reference to the accompanying drawings and examples, in which embodiments of the inventive concepts are shown. These inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art.

The present inventive concepts include the use of a first phase difference and a second phase difference of two clock signals between two systems to determine a round-trip transmission delay between the two systems. The present inventive concepts may determine the round-trip transmission delay even if the two clock signals are separate signals which may vary over time and circumstances.

According to embodiments of the present inventive concepts, two systems may utilize two clock signals to synchronize operations between the systems. In some embodiments the two clock signals may be independent of one another. In some embodiments, the two clock signals may operate at different frequencies. In some embodiments of the present inventive concepts, operations performed on the two clock signals may allow for continuous adjustment of the synchronization between the two systems even if lags in the transmission of the two clock signals change over time. Thus, the present inventive concepts provide a way to maintain synchronization between two systems in the face of changing environmental circumstances which may alter transmission characteristics of one or both of the clock signals.

As provided herein, a periodic reference signal is a signal which repeats at a periodic frequency and which may be used as a reference by the receiver. Examples of periodic reference signals are clock signals, pulse-per-second signals, etc. It will be understood by those of skill in the art that clock signals and pulse-per-second signals may both be termed as periodic reference signals even though they may operate at different frequencies. Thus, both pulse-per-second signals and clock signals may be referred to as periodic reference signals interchangeably herein. It will also be understood by those of skill in the art that other periodic reference signals are possible within the scope of the present inventive concepts.

As provided herein, a signal such as clock signal is described as being "at" a particular system when the signal is sampled at an output of a transmitting system or at an input of a receiving system. In other words, a signal at the transmitting system is the signal sampled with respect to a given time domain at the transmitter of the transmitting system. Similarly, a signal at the receiving system is the signal sampled with respect to a given time domain at the receiver of the receiving system. Thus, when transmission delays exist between a transmitting system and a receiving system, a signal at the receiving system will be time delayed from the same signal at the transmitting system.

FIG. 1 is a flowchart illustrating operations of a method for synchronizing operations between integrated circuits according to some embodiments of the present inventive concepts.

As illustrated in FIG. 1, the method may involve a step 110 of transmitting a first periodic reference signal from a first transmitter associated with a first integrated circuit of a first system, to a receiver associated with a second integrated circuit of a second system. The first and second systems may be communicatively coupled via an electronic transmission medium, and the periodic reference signal may pass over the electronic transmission medium. In some embodiments, the first and second systems may be connected via a backplane of a communication system or other data processing system.

The first periodic reference signal may be used to synchronize operations at the second system with the first system. In other words, the second system may use the periodic reference signal provided by the first system as a synchronizing element which provides a common time designation between the two systems.

In some embodiments, the first periodic reference signal may be a first clock signal, but the present inventive concepts are not limited thereto. The clock signal may have a first repeating edge of the clock signal that repeats at a predetermined constant frequency within the clock signal to synchronize operations of the second system. Within the scope of the present inventive concepts, a constant predetermined frequency will be understood to mean a frequency known by both the first system and second system. The second system may be configured to synchronize operations based on at least one of the repeating edges of the clock signal. The constant predetermined frequency may refer to the frequency at which a first edge of the clock signal repeats. In some embodiments, the first repeating edge may be an edge of the clock signal that is specified to vary within a predetermined range with a predetermined tolerance, and is used by a system's designer to configure the synchronization of different components or systems.

The method may further involve a step 120 including receiving a second periodic reference signal at the first system from a second transmitter associated with a third integrated circuit of the second system. In some embodiments, the second periodic reference signal may pass over a different electronic transmission medium between the first and the second system.

The second periodic reference signal may be used to synchronize operations at the first system with the second system, but the present inventive concepts are not limited thereto. In some embodiments, the first system may use the second periodic signal as a feedback path between the second system and the first system. That is to say that the first system observes the second periodic reference signal to determine the synchronization status of the second system.

In some embodiments, the second periodic reference signal may be a second clock signal. The second clock signal may be independent of the first clock signal. In some embodiments, the second clock signal may operate at a different frequency than the first clock signal.

The method may further involve a step 130 including receiving at the first system a first phase difference determined by the second system. In some embodiments, the first phase difference may be determined between the first periodic reference signal at the second system and the second periodic reference signal at the second system. In some embodiments, the first phase difference may be a first time deviation between corresponding edges of the first periodic reference signal at the second system and the second periodic reference signal at the second system.

The method may further involve a step 140 including determining a second phase difference at the first system. The second phase difference may be determined between the first periodic reference signal at the first system and the second periodic reference signal at the first system. In some embodiments, the second phase difference may be a second time deviation between corresponding edges of the first periodic reference signal at the first system and the second periodic reference signal at the first system.

The method may further involve a step 150 involving determining a difference between the first phase difference and the second phase difference. In some embodiments, the difference between the first phase difference and the second phase difference may be used to calculate a round-trip delay associated with the transmissions of the first periodic reference signal and the second periodic reference signal between the first system and the second system. The round-trip delay may include a first portion which is the delay in the transmission of the first periodic reference signal from the first system to the second system, and a second portion which is the delay in the transmission of the second periodic reference signal from the second system to the first system.

Figure 2:
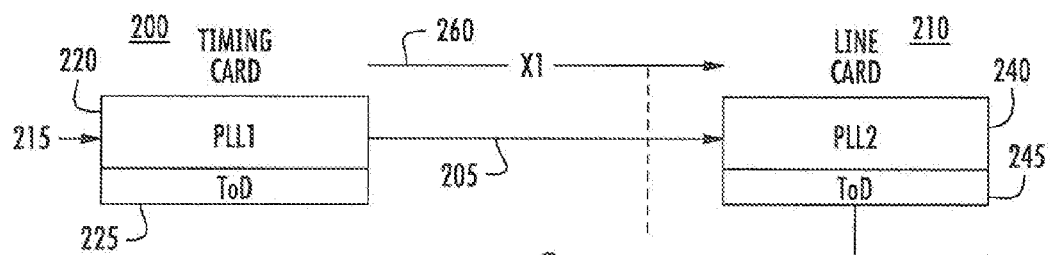
FIG. 2 is a block diagram illustrating a signal transmission between two systems according to some embodiments of the present inventive concepts.

FIG. 2 is a block diagram illustrating a signal transmission between two systems according to some embodiments of the present inventive concepts.

As illustrated in FIG. 2, a first system 200 may transmit a periodic reference signal 205 to a second system 210. The periodic reference signal 205 may be used by the second system 210 to synchronize operations to the periodic reference signal 205. In some embodiments, the periodic reference signal 205 may be a clock signal.

In some embodiments, the first system 200 may be a timing card and the second system 210 may be a line card. The timing card 200 and the line card 210 may be communicatively coupled to one another over the backplane of a communications system. The timing card 200 may provide a master clock signal 205 to the line card 210. The line card 210 may synchronize operations of the line card 210 such as telecommunications operations, to the master clock signal 205. In some embodiments, the timing card 200 may be communicatively coupled to multiple line cards 210, each receiving the master clock signal 205.

The timing card 200 may include a first phase-locked loop (PLL) 220. The first PLL 220 may be communicatively coupled to a first Time of Day (ToD) module 225 on the timing card 200. The first PLL 220 may be configured to lock to an input signal 215 provided to the first PLL 220. The input signal 215 may be a clock signal from an external network or another signal source. An output of the first PLL 220 may be configured to be transmitted to the line card 210 as the periodic reference signal 205 as, for example, a clock signal. The first PLL 220 may be configured to adjust the first ToD module 225 according to the periodic reference signal 205.

The line card 210 may include a second PLL 240. The second PLL 240 may be communicatively coupled to a second ToD module 245. The second PLL 240 may be configured to lock to an input signal corresponding to the periodic reference signal 205. The second ToD module 245 may be configured to provide a timing signal to other elements associated with the line card 210. The second PLL 240 may be configured to adjust the second ToD module 245 according to the periodic reference signal 205. In this way, the second PLL 240 can adjust the output of the second ToD module 245 so as to time-align the other elements associated with the line card 210 with the periodic reference signal 205.

Because of the physical properties of the electronic transmission medium between the timing card 200 and the line card 210, there can be a delay 260 in the transmission of the periodic reference signal 205, such as the clock signal 205, transmitted between the timing card 200 and the line card 210.

Figure 3:
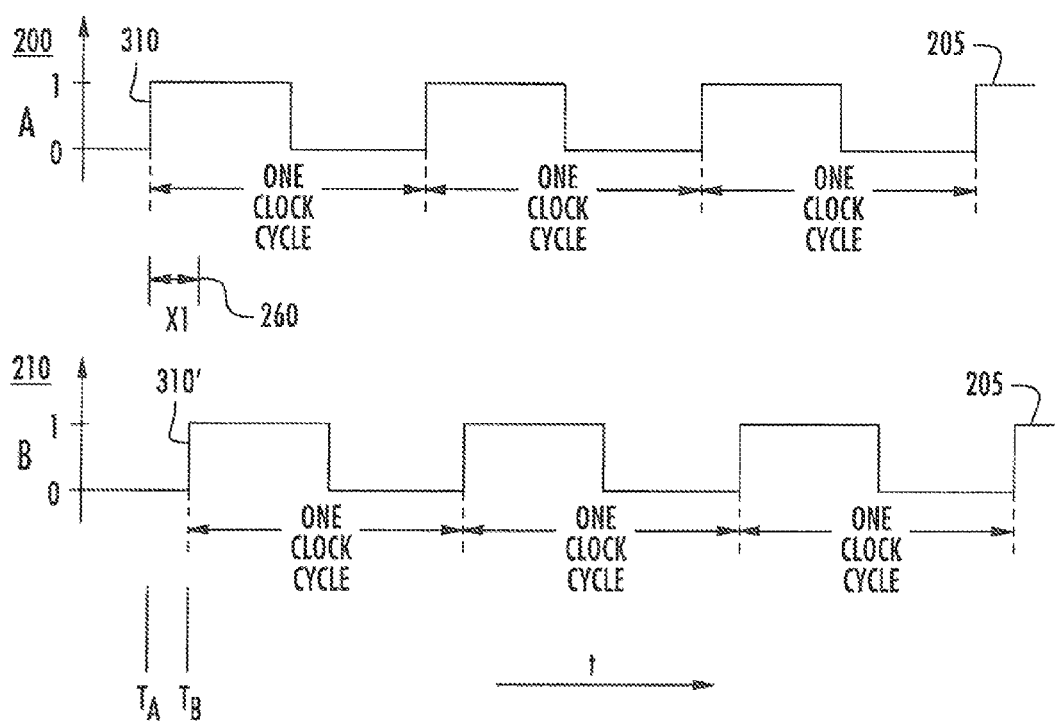
FIG. 3 is a timing diagram illustrating a clock signal at the transmitting portion of a first system and at the receiving portion of a second system according to some embodiments of the present inventive concepts.

FIG. 3 is a timing diagram illustrating a clock signal 205 at the transmitting portion of the first system 200 and at the receiving portion of the second system 210 according to some embodiments of the present inventive concepts.

As illustrated in FIG. 3, the timing diagram A illustrates the clock signal 205 as transmitted at the first system 200. The timing diagram B illustrates the same clock signal 205 as received at the second system 210.

As illustrated in the timing diagram A, when transmitted from the first system 200, the clock signal 205 has a first edge 310 which rises at a time $T_A$. However, due to transmission delays associated with the transmission line, the first edge 310 will arrive at a time $T_B$, later than $T_A$ at the second system 210.

As illustrated in the timing diagram B, when received at the second system 210, the first edge 310' of the clock signal 205 arrives at a time $T_B$ later than the original time $T_A$. The difference between the two times, $T_B - T_A$, is the transmission delay 260, illustrated as X1 in FIG. 3, caused by propagation delays in the transmission medium. A result of this relationship is that a given edge of the clock signal 205 sent at time $T_x$ from the first system 200 will arrive at the second system 210 at time $T_x + X1$.

The delay 260 may have causes such as the physical properties of transmission medium or the environmental conditions of the transmission. While the physical properties of the transmission medium may be somewhat calculated in advance by system designers. Environmental conditions, such as temperature or humidity, may vary over time and are difficult to predict. Thus, the conditions of the first system 200 and/or the second system 210 may unpredictably affect reference signals such as a clock signal 205 transmitted between the two systems such that a signal 205 as seen at a receiving system 210 may be time-delayed from the signal 205 seen at the transmitting system 200.

Because the second system 210 may be attempting to synchronize its operations to the clock signal 205 provided by the first system 200, the propagation delay 260 in the clock signal 205 may introduce errors in the synchronization. As appreciated by the present inventors, determining and adjusting for the propagation delay 260, including a propagation delay 260 that may be variable over time, is desirable.

As appreciated by the present inventors, one barrier to determining the propagation delay 260 is that the transmitting system 200 has no access to the clock signal 205 at the receiving system 210. Similarly, the receiving system 210 has no access to the clock signal 205 at the transmitting system 210. Because both systems have a single view of the clock signal 205, they are individually unable to determine the propagation delay 260.

One solution would be to directly feed the clock signal 205 from the second system 210 back to the first system 200 as an uninterrupted loopback signal. Such a solution would provide the first system 200 with the clock signal 205 that was transmitted to the second system 210 and returned to the first system 200. By comparing the clock signal 205 sent versus the clock signal 205 received, the first system 200 could calculate a round-trip delay between the first system 200 and the second system 210. However, as appreciated by the present inventors, such a solution suffers from multiple issues. First, such a signal would require a dedicated loopback transmission between the first system 200 and the second system 210. The loopback transmission would need to remain at the same frequency as the original transmission and efforts would be required to distort the signal as little as possible to avoid skewing any propagation delay calculation. In addition, such a solution does not scale well in modern systems. Though FIGS. 2 and 3 represent a single first system 200 and a single second system 210, many implementations, such as timing cards and line cards of telecommunications systems, provide for one or more timing cards, each controlling multiple line cards. When multiple cards are involved, loopback signals would require a timing card to maintain separate loopback signals for each line card. Such an infrastructure would be burdensome.

Figure 4:
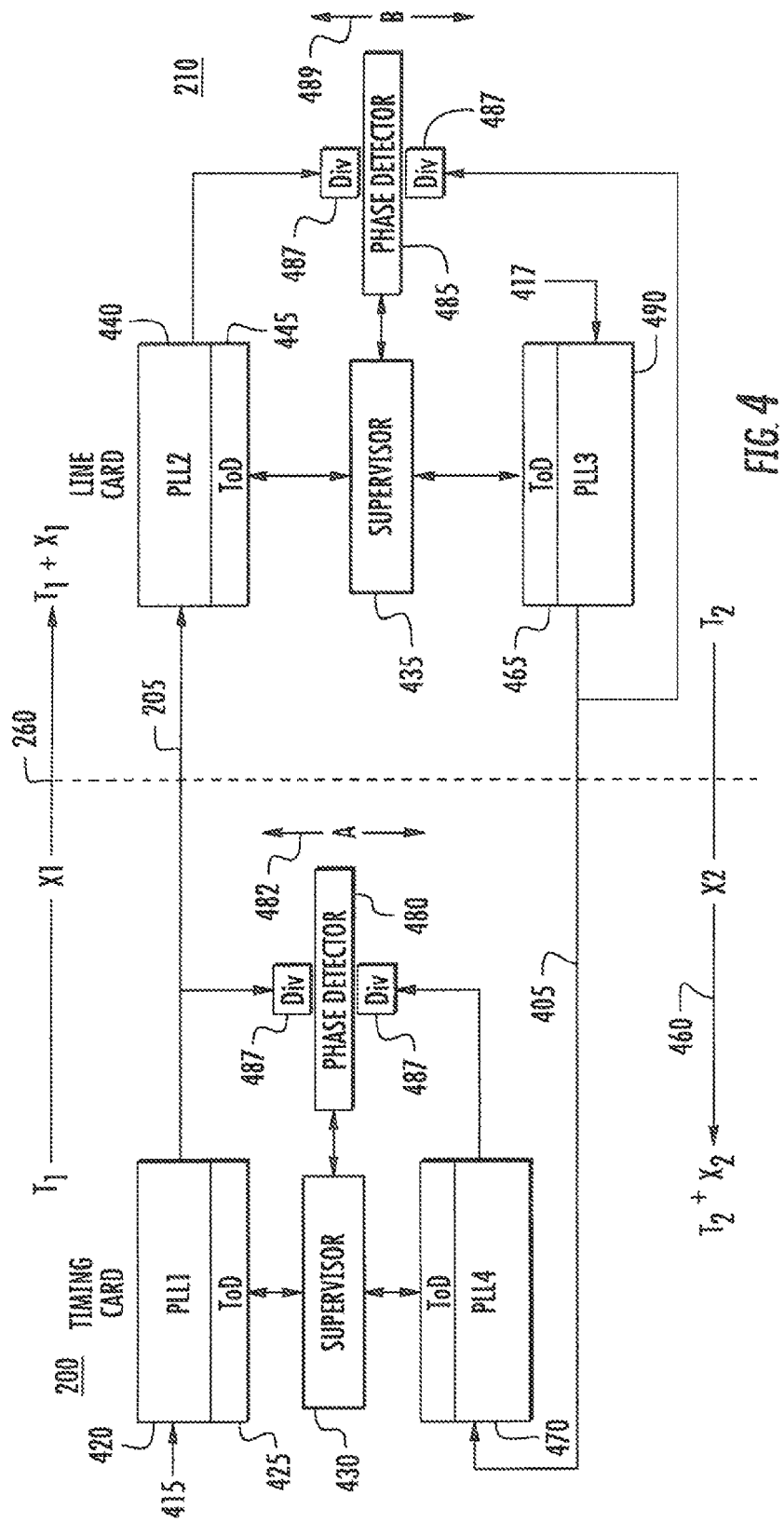
FIG. 4 is a block diagram illustrating a system architecture for synchronizing two systems according to some embodiments of the present inventive concepts.

FIG. 4 is a block diagram illustrating a system architecture for synchronizing operations of two systems according to some embodiments of the present inventive concepts.

The system architecture of FIG. 4 may include two periodic reference signals, a first periodic reference signal 205 sent from a first system 200 to a second system 210, and a second periodic reference signal 405 sent from the second system 210 to the first system 200. By computing two phase differences between the two signals, one phase difference taken at the first system 200 and the other phase difference taken at the second system 210, the round-trip delay of transmissions between the two systems may be determined.

As illustrated in FIG. 4, an example embodiment of the present inventive concepts includes a first integrated circuit 420 of the first system 200 transmitting a first periodic reference signal 205 to a second integrated circuit 440 of the second system 210, and a third integrated circuit 490 of the second system 210 transmitting a second periodic reference signal 405 to a fourth integrated circuit 470 of the first system 200. In some embodiments, the first integrated circuit 420 may be a first PLL, the second integrated circuit 440 may be a second PLL, the third integrated circuit 490 may be a third PLL, and the fourth integrated circuit 470 may be a fourth PLL.

The first periodic reference signal 205 may be used by the second system 210 to synchronize operations to the first periodic reference signal 205. In some embodiments, the first periodic reference signal 205 may be a first clock signal. The second periodic reference signal 405 may be used to provide the first system 200 with a time reference for operations performed by the second system 210. In some embodiments, the second periodic reference signal 405 may be a second clock signal. In some embodiments, the first clock signal 205 and the second clock signal 405 may be independent of one another. In some embodiments, the first clock signal 205 may periodically repeat at a first frequency and the second clock signal 405 may periodically repeat at a second frequency. In some embodiments, the first frequency and the second frequency may be different.

In some embodiments, the first system 200 may be a timing card and the second system 210 may be a line card. The timing card 200 and the line card 210 may be communicatively coupled to one another over the backplane of a communications system. The timing card 200 may provide a master clock signal 205 to the line card 210. The timing card 210 may synchronize operations such as telecommunications operations, to the master clock signal 205. In some embodiments, the timing card 200 may be communicatively coupled to multiple line cards 210, each receiving the master clock signal 205.

The first PLL 420 may be communicatively coupled to a first ToD module 425 on the timing card 200. The first PLL 420 may be configured to lock to a first input signal 415 provided to the first PLL 420. The first input signal 415 may be a clock signal from an external network or another signal source. In some embodiments, the first input signal 415 may be provided by a line card 210. An output of the first PLL 420 may be configured to be transmitted to the line card 210 as the first periodic reference signal 205, such as the first clock signal. The first PLL 420 may be configured to adjust the first ToD module 425 according to the first periodic reference signal 205.

The line card 210 may include the second PLL 440. The second PLL 440 may be communicatively coupled to a second ToD module 445. The second PLL 440 may be configured to lock to an input signal corresponding to the first periodic reference signal 205. The second ToD module 445 may be configured to provide a timing signal to other elements associated with the line card 410. The second PLL 440 may be configured to adjust the second ToD module 445 according to the first periodic reference signal 205. In this way, the second PLL 440 can adjust the output of the second ToD module 445 so as to time-align the other elements associated with the line card 210 with the first periodic reference signal 205.

The line card 210 may also include the third PLL 490. The third PLL 490 may be configured to lock to a second input signal 417 provided to the third PLL 490. The second input signal 417 may be a clock signal from an external network or another signal source. In some embodiments, the first input signal 415 and the second input signal 417 may be the same signal. In some embodiments, the first input signal 415 and the second input signal 417 may be different signals. An output of the third PLL 490 may be configured to be transmitted to the timing card 200 as the second periodic reference signal 405, such as a second clock signal. In some embodiments, the second clock signal 405 may repeat at a frequency different than that of the first clock signal 205.

The timing card 200 may include the fourth PLL 470. The fourth PLL 470 may be configured to lock to an input signal corresponding to the second periodic reference signal 405. In some embodiments, the fourth PLL 470 may receive the second clock signal 405.

On the timing card 200, the output signal from the first PLL 420 and the input signal to the fourth PLL 470 at the timing card 200 may be input into a first phase detector 480.

The first phase detector 480 may be configured to determine a first phase difference 482 (illustrated as 'A' in FIG. 4) between the first periodic reference signal 205 at the first system 200, as output from the first PLL 420, and the second periodic reference signal 405 at the first system 200, as input into the fourth PLL 470. Determining the first phase difference 482 between the first periodic reference signal 205 and the second periodic reference signal 405 may include determining a difference in time alignment between corresponding edges of the first periodic reference signal 205 and the second periodic reference signal 405. For example, in some embodiments the phase detector 480 may determine a first phase difference 482 in time between a first edge of the first clock signal 205 and a corresponding second edge of the second clock signal 405 as seen at the first system 200.

The inputs to the first phase detector 480 may include a frequency divider 487. The frequency divider 487 may allow for the frequency of the first periodic reference signal 205 and/or the frequency of the second periodic reference signal 405 at the first system 200 to be altered before being compared by the first phase detector 480. The frequency divider 487 may be configured so as to allow the first phase detector 480 to determine a first phase difference 482 of input signals of different frequencies.

The timing card 200 may include a first supervisor 430. The first supervisor 430 may be communicatively coupled to the first PLL 420, the fourth PLL 470 and the first phase detector 480. The first supervisor 430 may exchange data with, and adjust operations of, the elements of the timing card 200.

On the line card 210, the input signal to the second PLL 440 and the output signal from the third PLL 490 at the second system 210 may be input into a second phase detector 485.

The second phase detector 485 may be configured to determine a second phase difference 489 (illustrated as 'B' in FIG. 4) between the first periodic reference signal 205 at the second system 210, as input to the second PLL 440, and the second periodic reference signal 405 at the second system 210, as output from the third PLL 490. Determining the second phase difference 489 between the first periodic reference signal 205 and the second periodic reference signal 405 may include determining a difference in time alignment between corresponding edges of the first periodic reference signal 205 and the second periodic reference signal 405. For example, in some embodiments the second phase detector 485 may determine the second phase difference 489 in time between a first edge of the first clock signal 205 and a corresponding second edge of the second clock signal 405 as seen at the second system 210.

The inputs to the second phase detector 485 may include a frequency divider 487. The frequency divider 487 may allow for the frequency of the first periodic reference signal 205 and/or the frequency of the second periodic reference signal 405 at the second system 210 to be altered before being compared by the second phase detector 485. The frequency divider 487 may be configured so as to allow the second phase detector 485 to determine a second phase difference 489 of input signals of different frequencies.

The line card 210 may include a second supervisor 435. The second supervisor 435 may be communicatively coupled to the second PLL 440, the third PLL 490 and the second phase detector 485. The second supervisor 435 may exchange data with, and adjust operations of, the elements of the line card 210.

As discussed herein, the first periodic reference signal 205 and the second periodic reference signal 405 may encounter propagation delays in transmission between the first system 200 and the second system 210. That is to say that the first periodic reference signal 205 may have a first transmission delay 260 between the first periodic reference signal 205 transmitted at the first system 200 and the first periodic reference signal 205 received at the second system. Similarly, the second periodic reference signal 405 may have a second transmission delay 460 between the second periodic reference signal 405 transmitted at the second system 210 and the second periodic reference signal 405 received at the first system 200. In some embodiments, the first transmission delay 260 and the second transmission delay 460 may different. In some embodiments, the electronic transmission medium between the first system 200 and the second system 210 may be configured so as to create a first transmission delay 260 and a second transmission delay 460 that are substantially the same.

As illustrated in FIG. 4, the first transmission delay 260 is shown as X1 while the second transmission delay 460 is shown as X2. Thus, as discussed with respect to FIG. 3, a given edge of the first periodic reference signal 205 that is transmitted at time $T_1$ from the first system 200 will arrive at the second system 210 at time $T_1+X1$. Similarly, a given edge of the second periodic reference signal 405 that is transmitted at time $T_2$ from the second system 210 will arrive at the first system 200 at time $T_2+X2$.

The present inventive concepts include the use of the first phase difference 482 and the second phase difference 489 to determine the round-trip transmission delay, that is, the first transmission delay 260 plus the second transmission delay 460, even if the first periodic reference signal 205 and the second periodic reference signal 405 are separate independent signals which may vary over time and circumstances. The round-trip transmission delay can be used to determine the individual transmission delays (the first transmission delay 260 and the second transmission delay 460) between the two systems. The individual transmission delays can then be used by the first system 200 and/or the second system 210 to adjust their synchronization to the first periodic reference signal 205 and/or the second periodic reference signal 405.

Figure 5A:
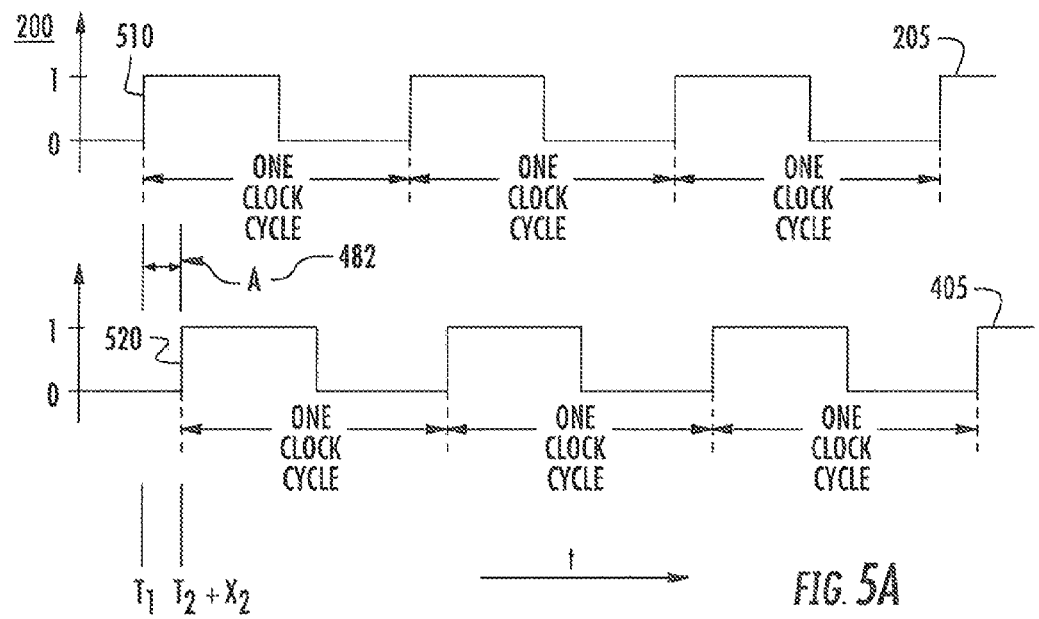
FIGS. 5A and 5B are timing diagrams illustrating two pairs of clock signals as shown in FIG. 4 with further illustration of the signals at the transmitting system and at the receiving system.
Figure 5B:
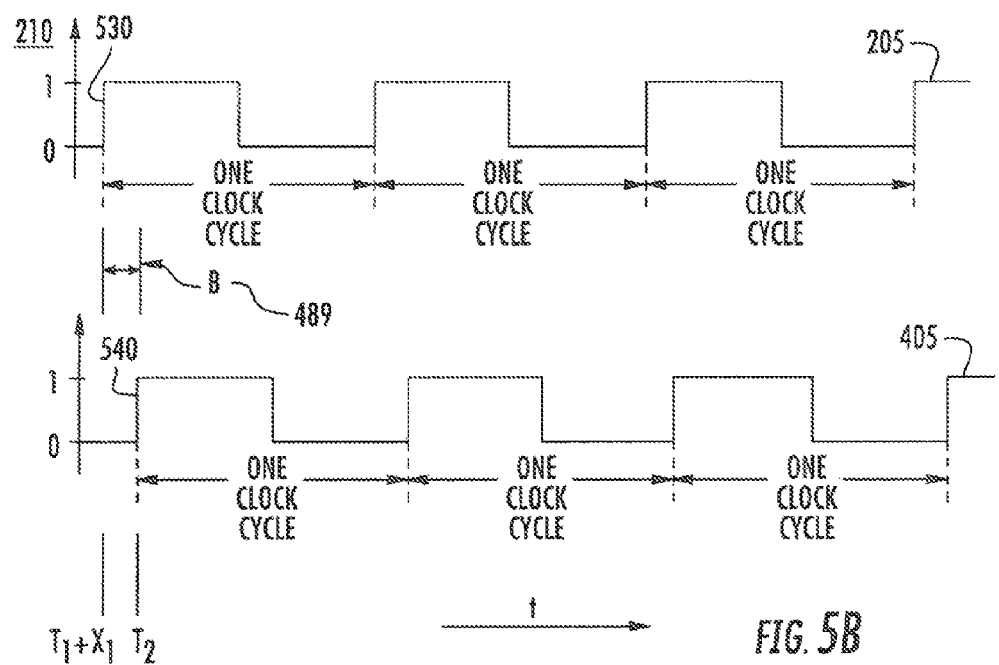

FIGS. 5A and 5B are timing diagrams illustrating two pairs of clock signals as shown in FIG. 4 with further illustration of the signals at the transmitting system and at the receiving system.

FIG. 5A illustrates the first periodic reference signal 205 and the second periodic reference signal 405 as seen at the first system 200. As illustrated in FIG. 4, the first periodic reference signal 205 is transmitted from the first system 200 while the second periodic reference signal 405 is received at the first system 200. In some embodiments, the first periodic reference signal 205 and the second periodic reference signal 405 are independent signals which are separately generated.

As illustrated in FIG. 5A, the second periodic reference signal 405 may be compared with the first periodic reference signal 205. This comparison may be performed by the first phase detector 480. As described herein, the first periodic reference signal 205 and the second periodic reference signal 405 may be input into a frequency divider 487 prior to their comparison so as to generate signals of comparable frequencies. The first phase detector 480 may determine that the second periodic reference signal 405 has a first phase difference 482 with the first periodic reference signal 205. That is to say that a respective first edge 510 of the first periodic reference signal 205 may be earlier in time than a second similar edge 520 of the second periodic reference signal 405. It should be noted that, since the first periodic reference signal 205 and the second periodic reference signal 405 are separate signals, the first phase difference 482 is not a propagation delay for either of the signals. Instead, the first phase difference 482 represents a relative difference between the two signals.

For example, as discussed with respect to FIG. 4, a given edge of the first periodic reference signal 205 transmitted from the first system 200 at time $T_1$ may arrive at the second system 210 at time $T_1$+X1. Similarly, a given edge of the second periodic reference signal 405 transmitted from the second system 210 at time T2 may arrive at the first system 200 at time $T_2$+X2. Thus, a comparison at the first system 200 of the first edge 510 of the first periodic reference signal 205 may be at a time $T_1$ while the second edge 520 of the second periodic reference signal 405 may be at a time $T_2$+X2.

FIG. 5B illustrates the first periodic reference signal 205 and the second periodic reference signal 405 as seen at the second system 210. As illustrated in FIG. 4, the first periodic reference signal 205 is received at the second system 210 while the second periodic reference signal 405 is transmitted from the second system 210.

As illustrated in FIG. 5B, the second periodic reference signal 405 may be compared with the first periodic reference signal 205. This comparison may be performed by the second phase detector 485. As described herein, the first periodic reference signal 205 and the second periodic reference signal 405 may be input into a frequency divider 487 prior to their comparison by the second phase detector 485 so as to generate signals of comparable frequencies. The second phase detector 485 may determine that the second periodic reference signal 405 has a second phase difference 489 with the first periodic reference signal 205. That is to say that a respective first edge 530 of the first periodic reference signal 205 may be earlier in time than a second similar edge 540 of the second periodic reference signal 405. It should be noted that, since the first periodic reference signal 205 and the second periodic reference signal 405 are separate signals, the second phase difference 489 is not a propagation delay for either of the signals. Instead, the second phase difference 489 represents a relative difference between the two signals.

For example, as discussed with respect to FIG. 4, a given edge of the first periodic reference signal 205 transmitted from the first system 200 at time $T_1$ may arrive at the second system 210 at time $T_1$+X1. Similarly, a given edge of the second periodic reference signal 405 transmitted from the second system 210 at time T2 may arrive at the first system 200 at time $T_2$+X2. Thus, a comparison at the second system 210 of the first edge 530 of the first periodic reference signal 205 may be at a time $T_1$+X1 while the second edge 540 of the second periodic reference signal 405 may be at a time $T_2$.

As illustrated in FIGS. 5A and 5B, it can be seen that the first phase difference 482 between a selected edge of the first periodic reference signal 205 at the first system 200 and a corresponding edge of the second periodic reference signal 405 at the first system 200 can be written as (($T_2$+X2)–$T_1$). Similarly, it can be seen that the second phase difference 489 between a selected edge of the first periodic reference signal 205 at the second system 210 and a corresponding edge of the second periodic reference signal 405 at the second system 210 can be written as ($T_2$–($T_1$+X1)). Subtracting the second phase difference 489 from the first phase difference 482 leads to the equation: (($T_2$+X2)–$T_1$)–($T_2$–($T_1$+X1)). This equation simplifies to X2+X1. Thus, the round trip delay, which is the first transmission delay 260 plus the second transmission delay 460 (X1+X2), can be determined by subtracting the second phase difference 489 from the first phase difference 482.

In some embodiments, the first system 200 and the second system 210 as well as the electronic transmission medium between them can be configured so as to make the first transmission delay 260 and the second transmission delay 460 substantially the same. As a result, the individual transmission delay 260/460 may be determined by halving the round-trip delay.

Referring back to FIG. 4, in some embodiments the difference between the second phase difference 489 and the first phase difference 482 is determined by at least one of the two systems receiving both phase differences. In some embodiments, the second system 210 can determine the second phase difference 489 and transmit the second phase difference 489 to the first system 200 to allow the first system 200 to calculate the round-trip delay. When the first system 200 has calculated the round-trip delay, the first system 200 can transmit information based on the round-trip delay to the second system 210 to allow the second system 210 to adjust its second PLL 440 to account for the first transmission delay 260. In these embodiments, the first supervisor 430 may be responsible for calculating the round-trip delay and transmitting the round-trip delay to the second system 210. The second supervisor 435 may be responsible for calculating the second phase difference 489, receiving the information based on the round-trip delay, and/or adjusting the second PLL 440 on the second system 210.

In some embodiments, the first system can determine the first phase difference 482 and transmit the first phase difference to the second system 210 to allow the second system 210 to calculate the round-trip delay. When the second system 210 has calculated the round-trip delay, the second system 210 can adjust its second PLL 440 to account for the first transmission delay 260. In these embodiments, the first supervisor 430 may be responsible for transmitting the first phase difference 482 to the second system 210. The second supervisor 435 may be responsible for receiving first phase difference 482, determining the second phase difference 489, calculating the round-trip delay, and/or adjusting the second PLL 440 on the second system 210.

Though various possibilities for operations related to determining the difference between the first phase difference 482 at the first system 200 and the second phase difference 489 at the second system 210 have been described, it will be recognized that there are alternative methods to performing these calculations that would be understood by one of ordinary skill in the art which are included within the present inventive concepts.

According to embodiments of the present inventive concepts, the first supervisor 430 and the second supervisor 435 may be implemented as integrated circuits in the first system 200 and/or the second system 210, respectively. In some embodiments, the first supervisor 430 and the second supervisor 435 may be implemented as computer code executed by a processor on the first system 200 and/or the second system 210, respectively.

Similarly, according to embodiments of the present inventive concepts, the first phase detector 480 and the second phase detector 485 may be implemented as integrated circuits in the first system 200 and/or the second system 210, respectively. In some embodiments, the first phase detector 480 and the second phase detector 485 may include operations implemented as computer code executed by a processor on the first system 200 and/or the second system 210, respectively.

Though illustrated as a single transmission line in FIG. 4, it will be understood that transmissions between the first system 200 and the second system 210 may be accomplished over various combinations of physical connections. For example, in some embodiments, the transmission of the first phase difference 482, the second phase difference 489, and/or the round-trip delay may be accomplished over one or more separate transmission methods between the first system 200 and the second system 210. In some embodiments, as described herein, the transmission of the first phase difference 482, the second phase difference 489, and/or the round-trip delay may share a transmission medium with one or more of the periodic reference signals.

Also, though illustrated as a single transmission line in FIG. 4, the first periodic reference signal 205 and/or the second periodic reference signal 405 may be composed of multiple signals. For example, in some embodiments, the first periodic reference signal 205 may include a clock signal, a pulse per second signal, and a ToD data portion.

Figure 6:
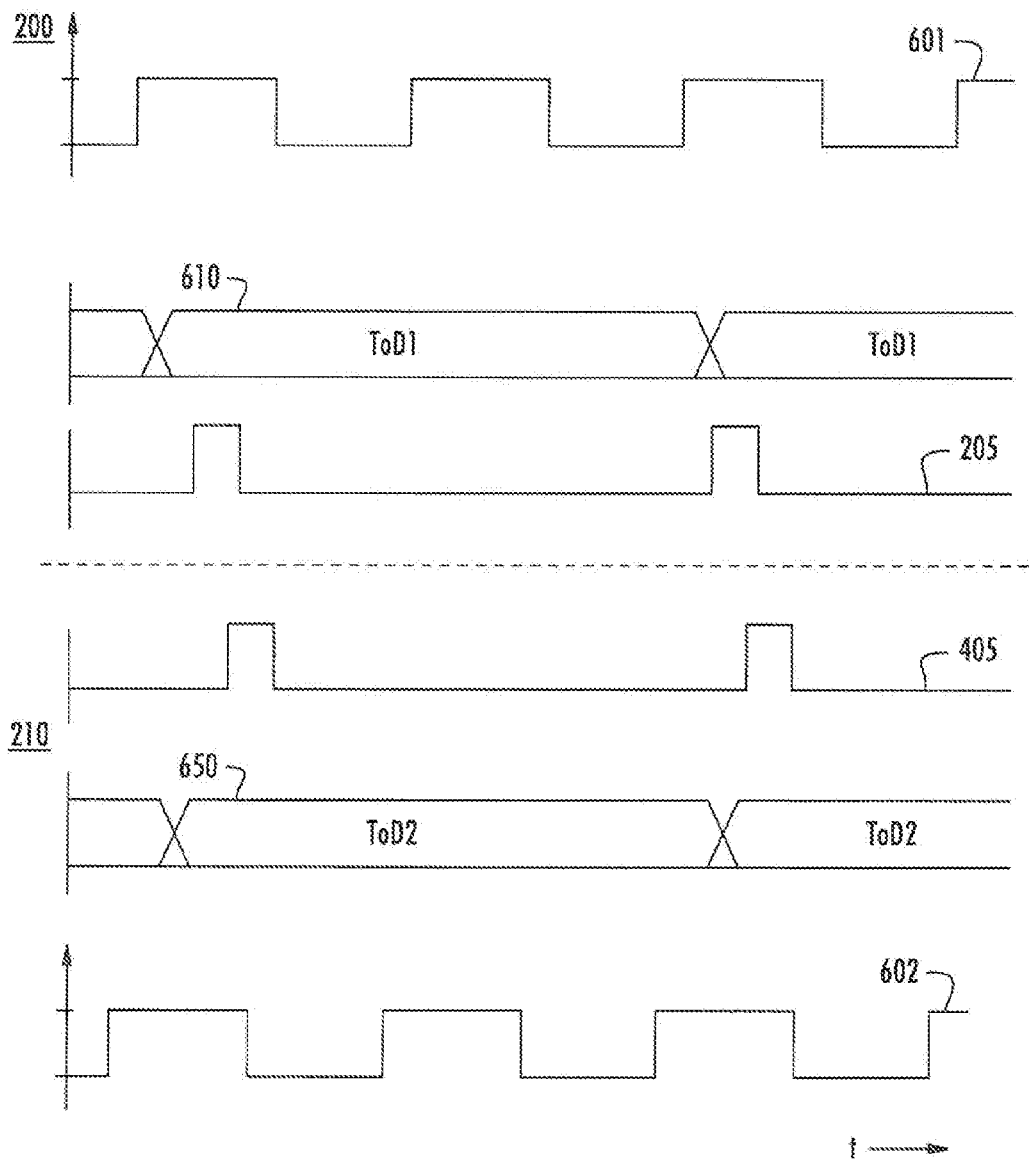
FIG. 6 is a timing diagram illustrating two clock signals as shown in FIG. 4 with additional illustration of a pulse-per-second signal and a Time of Day signal for each of the two clock signals.

FIG. 6 is a timing diagram illustrating two clock signals as shown in FIG. 4 with additional illustration of a pulse-per-second (PPS) signal and a ToD signal for each of the two clock signals.

As illustrated in FIG. 6, embodiments of the present inventive concepts can include a first clock signal 601 transmitted from the first system 200 to the second system 210. The first clock signal 601 may run at a relatively high frequency. In some embodiments, the frequency of the first clock signal 601 may be 25 MHz. A second clock signal 602 may also be included that is transmitted from the second system 210 to the first system 200. The second clock signal 602 may also run at a relatively high frequency. In some embodiments, the frequency of the second clock signal 602 may be different from the frequency of the first clock signal 601. In some embodiments, the frequency of the second clock signal 602 may be 19.44 MHz.

The first clock signal 601 may be accompanied by a first pulse-per-second (PPS) signal 205. The first PPS signal 205 may include a portion of the signal that transitions from a low state to a high state at least one per second. The first PPS signal 205 may be transmitted from the first system 200 to the second system 210 to be used by the second system 210 as a phase marker. The PPS signal 205 may delineate a transition in a clock associated with the first clock signal 601 to a new second value. Stated another way, the first clock signal 601 may be associated with a clock that includes both seconds and associated subsecond values. A given value of the clock may include a particular number of seconds as well as some number of subseconds. At the moment the clock value transitions to a new value for the seconds field (increments by one), the values for the subseconds of the clock value are zero. The transition of the first PPS signal 205 indicates this incrementing of the seconds value and indicates that the value of any subseconds associated with the clock are zero.

In addition to the first PPS signal 205, the clock signal 601 may be accompanied by a first ToD data value 610. The first ToD data value 610 indicates the precise time value that the clock should have at the transition of the first PPS signal 205. Thus, upon detection of the transition of the first PPS signal 205 from a low state to a high state, the second system 210 (the receiving system) will be able to determine that the seconds value for the clock has incremented from the first PPS signal 205 and what the precise value for the clock should be from the first ToD data value 610.

FIG. 6 also illustrates the second clock signal 602. The second clock signal 602 may also be accompanied by a second PPS signal 405 and a second ToD data signal 650. The second PPS signal 405 and the second ToD data signal 650 may be used similarly with the second clock signal 602 as described herein with respect to the first clock signal 601. That is to say that the second PPS signal 405 and the second ToD data signal 650 may be transmitted to the first system 200 by the second system 210 and used by the first system 200 to identify precisely the clock value being transmitted by the second clock signal 602.

In some embodiments, when the first clock signal 601 and/or the second clock signal 602 are operating at relatively high frequencies, or at frequencies that are difficult to compare because of differences between the two frequencies, the first system 200 and the second system 210 may use phase markers associated with the clock signals as the first periodic reference signal 205 and the second periodic reference signal 405. That is to say that instead of determining phase differences between the clocks signals themselves, the first system 200 and the second system 210 may determine phase differences between the phase markers. Thus, referring to FIG. 4, the first phase detector 480 may determine a first phase difference 482 between the first PPS signal 205 at the first system 200 and the second PPS signal 405 at the first system 200. Similarly, the second phase detector 485 may determine a second phase difference 489 between the first PPS signal 205 at the second system 210 and the second PPS signal 405 at the second system 210. In other words, embodiments of the present inventive concepts may use phase markers associated with the clock signals to determine phase differences rather than the clock signals themselves without departing from the present inventive concepts.

Figure 7:
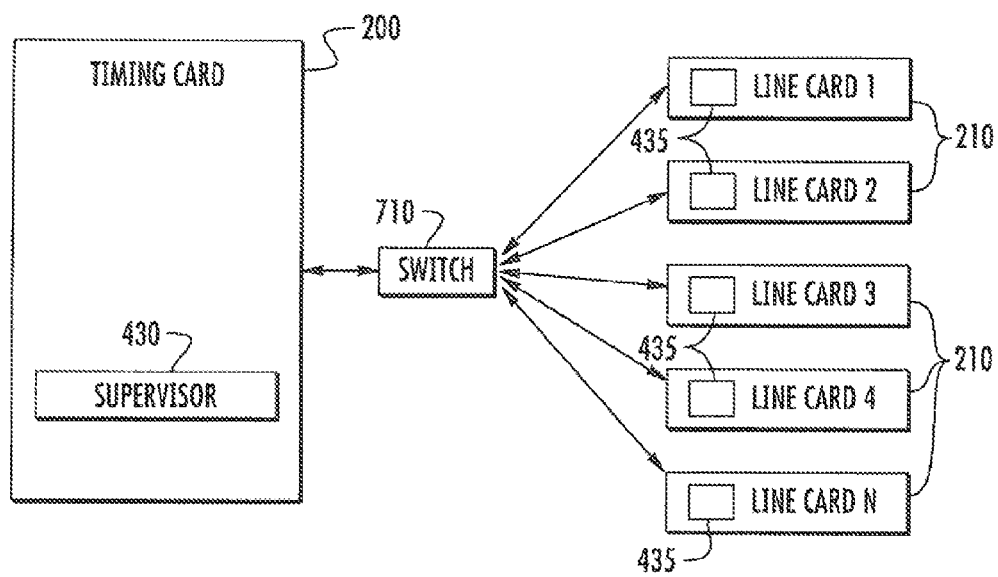
FIG. 7 is a block diagram of a system utilizing a single timing card communicatively coupled to multiple line cards, where the line cards separately synchronize their operations to the timing card according to some embodiments of the present inventive concepts.

FIG. 7 is a block diagram of a system utilizing a single timing card communicatively coupled to multiple line cards, where the line cards separately synchronize their operations to the timing card according to some embodiments of the present inventive concepts.

As illustrated in FIG. 7, the present inventive concepts can be extended to facilitate synchronization between a first timing card 200 and multiple line cards 210. In some embodiments, the first timing card 200 distributes a first periodic reference signal 205 to the group of line cards 210 which share the signal. Each of the line cards 210 may individually send a second periodic reference signal 405 back to the first timing card 200. By switching between each of the line cards 210, the first timing card 200 may sample the second periodic reference signal 405 provided for a respective line card 210 to determine the first phase difference 482. Each individual line card 210 may also determine the second phase difference 489 between the shared first periodic reference signal 205 and the second periodic reference signal 405 generated at each line card 210. In this way, the phase differences for each of the line cards 210 may be determined and individual round-trip delay values unique to each line card 210 may be determined.

FIG. 7 illustrates a switch 710 being used to transition between each of the individual line cards 210 but the present inventive concepts are not limited thereto. It will be understood by those of ordinary skill in the art that there are a multiple ways that the timing card 200 could transition between the signals provided by the line cards 210 without deviating from the present inventive concepts. In some embodiments, the second periodic reference signal 405 generated at each line card 210 may each individually be an input to the timing card 200. In other words, the individual second periodic reference signals 405 may be point-to-point between the timing card 200 and the line card 210. Though only a single timing card 200 is illustrated in FIG. 7, in some embodiments of the present inventive concepts multiple timing cards 200 may be connected to the line cards 210. In such an embodiment, the line cards 210 may be configured to synchronize to the first periodic reference signal 205 transmitted by one of the timing cards 200.

Moreover, though the present inventive concepts discuss multiple transmissions being shared between a first system 200, such as a timing card, and a second system 210, such as a line card, some embodiments may transmit data using the first periodic reference signal 205 and the second periodic reference signal 405.

For example, as discussed in U.S. patent application Ser. No. 14/975,226 filed on Dec. 18, 2015, entitled "Methods and Apparatus for Transmitting Data Over a Clock Signal" and incorporated herein in its entirety, pulse width modulation of a clock signal can be used to encode a data transmission within a clock signal. For example, if the first periodic reference signal 205 is a first clock signal and the second periodic reference signal 405 is a second clock signal, the transmissions of the present inventive concepts may be encoded as data transmissions within either of the first clock signal 205 or the second clock signal 405.

For example, the data transmission may be encoded within either of the first clock signal 205 or the second clock signal 405 by varying a second edge of respective clock cycles within the clock signals while maintaining a first edge at a predetermined constant repeating frequency. By varying a width of portions of the signal between the first and the second edge of the clock cycle, a transmitter can encode data bits which can then be decoded by one or more receivers of the signal.

The present inventive concepts can further utilize the pulse width of a main synchronization clock to encode a synchronization pulse and/or a data communication channel on a single line. By manipulating one of the edges of the clock, such as an edge that is not used for synchronization, the duty cycle can be adjusted (for example, 25%, 50%, 75%). The adjusted duty cycle may be used to encode frames that mark the phase marker location and may use the frame to transmit and receive other communication data, such as the ToD data signal.

Figure 8A:
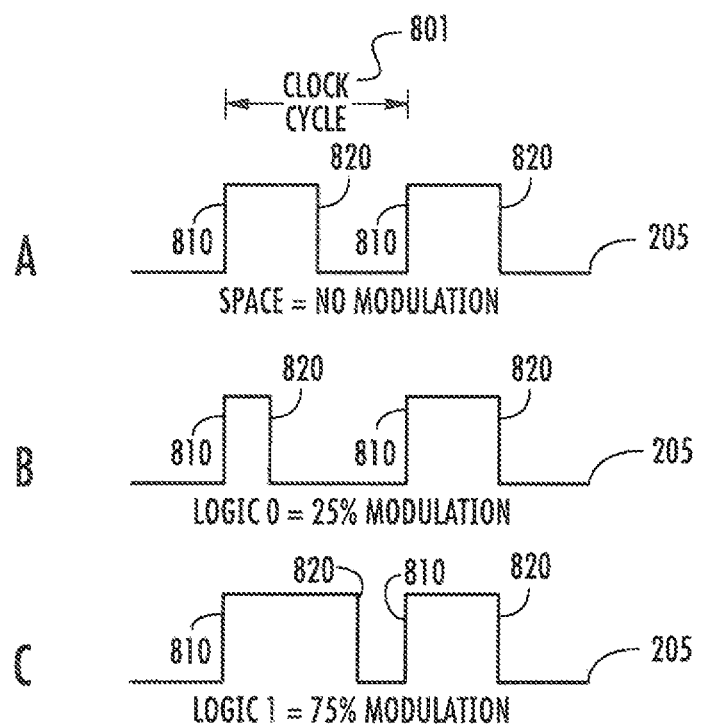
FIGS. 8A and 8B are timing diagrams illustrating clock signals for synchronizing operations and transmitting data according to some embodiments of the present inventive concepts.
Figure 8B:
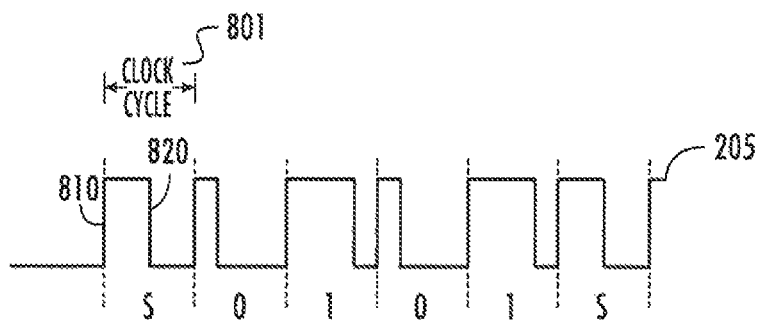

FIGS. 8A and 8B are timing diagrams illustrating clock signals for synchronizing operations and transmitting data according to some embodiments of the present inventive Three examples of modulation options are illustrated in FIG. 8A. Example A illustrates a first clock signal 205 with a 50% duty cycle. In some embodiments, a 50% duty cycle corresponds to the first edge 810 occurring at the beginning of a clock cycle 801 and the second edge 820 occurring halfway through the clock cycle 801. This example corresponds to a standard clock signal and employs no modulation. Within the first clock signal 205, a clock cycle 801 with no modulation may not be correlated with any data. In some embodiments, a clock cycle 801 with no modulation may be interpreted as a space, which may be used for data marking within the data transmission.

Example B illustrates a clock signal 205 with a duty cycle of less than 50%. In some embodiments, a duty cycle of less than 50% may correspond to 25%, but the present inventive concepts are not limited thereto. A 25% duty cycle corresponds to the first edge 810 occurring at the beginning of a clock cycle 801 and the second edge 820 occurring one quarter of the way through the clock cycle 801. Within the first clock signal 205, a clock cycle 801 with modulation of less than 50% may be correlated with a first data bit.

Example C illustrates a first clock signal 805 with a duty cycle of greater than 50%. In some embodiments, a duty cycle of greater than 50% may correspond to 75%, but the present inventive concepts are not limited thereto. A 75% duty cycle corresponds to the first edge 810 occurring at the beginning of a clock cycle 801 and the second edge 820 occurring three quarters of the way through the clock cycle 801. Within the clock signal 205, a clock cycle 801 with modulation of greater than 50% may be correlated with a second data bit.

It will be understood that though FIG. 8A illustrates only three potential pulse widths, other widths are possible without deviating from the present inventive concepts. Similarly, though two data bits and a space are illustrated, more data bits and/or alternate signal markers are possible corresponding to various and alternative widths without deviating from the present inventive concepts.

FIG. 8B illustrates a clock signal 205 encoded with a data transmission according to the present inventive concepts. The clock signal 205 may include multiple pulse widths between respective first edges 810 and second edges 820 which may correspond to respective data bits which can be decoded from the clock signal 205.

In some embodiments, these data bits can directly correspond to data bits of the data transmission. In some embodiments, the data bits may be further combined to be translated into symbols for the data transmission. For example, two adjacent data bits could be used for encoding additional symbols. In some embodiments, when the two bits equal a "00," a symbol corresponding to a SPACE may be decoded. In some embodiments, when the two bits equal a "01," a symbol corresponding to a ZERO may be decoded. In some embodiments, when the two bits equal a "10," a symbol corresponding to a ONE may be decoded. In some embodiments, when the two bits equal a "11," an error may be generated. It will be understood by one of skill in the art that other bit combinations are possible, as well as the use of additional bits for signal encoding and/or other additional symbols, without deviating from the present inventive concepts.

It will be understood that though only the first clock signal 205 is illustrated within FIGS. 8A and 8B, the methods described herein may work equally well with the second clock signal 405. The data transmission in the first clock signal 205 and the second clock signal 405 may operate in parallel and independently of one another.

Using the data transmission method outlined with respect to FIGS. 8A and 8B, either the first system 200 or the second system 210 may encode the first phase difference, 482, the second phase different 487, and/or the round-trip delay within either the first clock signal 205 and/or the second clock signal 405. Similarly, either the first system 200 or the second system 210 may encode a phase marker (e.g. a PPS signal) within either the first clock signal 205 and/or the second clock signal 405. In this way, the present inventive concepts can be realized without the provisioning of additional data lines within existing telecommunications systems.

Figure 9:
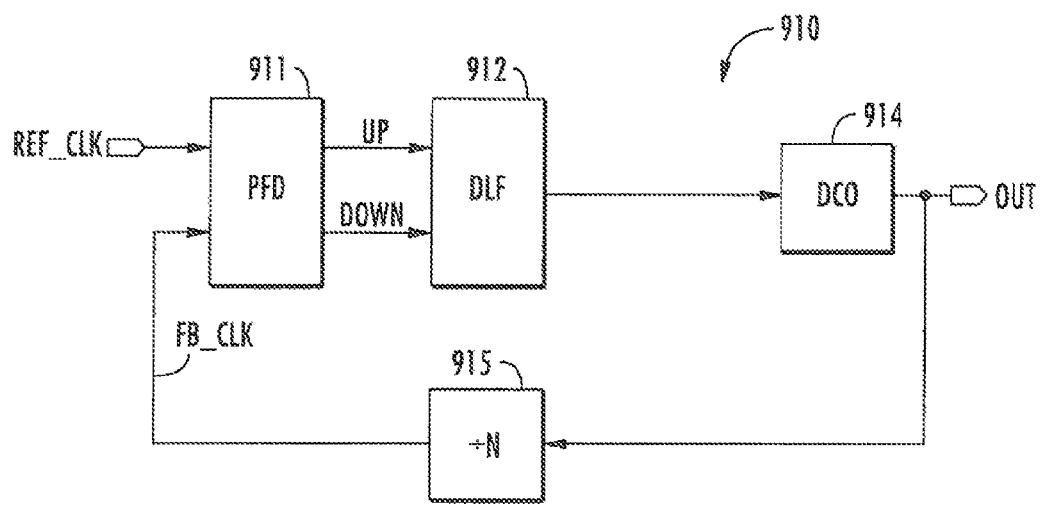
FIG. 9 is a block diagram of an example digital phase-locked loop according to example embodiments of the present inventive concepts.

FIG. 9 is a block diagram of an example digital phase-locked loop 910 according to example embodiments of the present inventive concepts. The phase-locked loop 910 may be included within the first system 200 and/or the second system 210 as described with additional detail in FIG. 4. Referring now to FIG. 9, a conventional digital phase-locked loop (DPLL) integrated circuit 910 is illustrated as including a phase-frequency detector (PFD or PD) 911, a digital loop filter (DLF) 912, a digitally controlled oscillator (DCO) 914 and a divide-by-N feedback divider 915. As shown, the phase-frequency detector 911 generates UP and DOWN control signals to the digital loop filter 912 in response to a comparison of a relative phase offset between a reference clock (REF_CLK) and feedback clock (FB_CLK) generated by the feedback divider 915. The digital loop filter 912 may alter the frequency of the signal provided as an input to the digitally controlled oscillator 914 in response to the UP and DOWN control signals.

It will be understood that though the PLL illustrated in FIG. 9 is a digital PLL, an analog PLL is equally possible without deviating from the present inventive concepts. Similarly, though FIG. 9 illustrates a DPLL 910 with example components, other DPLL designs may be understood by those of skill in the art and may be utilized without deviating from the present inventive concepts.

Figure 10:
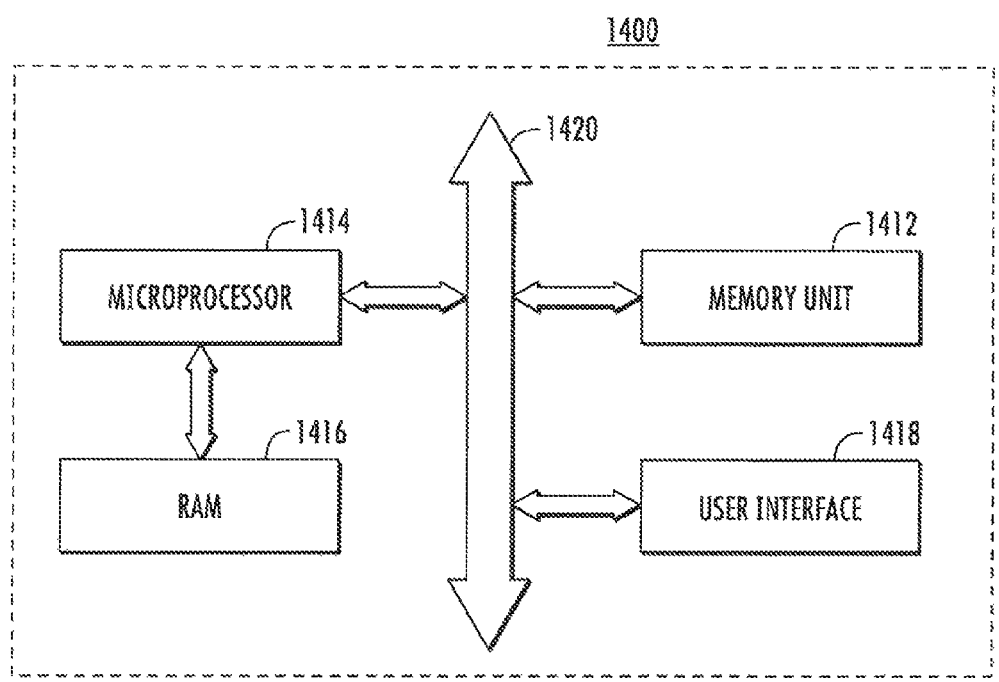
FIG. 10 is a block diagram of a processing system according to some embodiments of the present inventive concepts.

FIG. 10 is a block diagram of a processing system 1400 according to some embodiments of the present inventive concepts. In some embodiments, the first system 200 may comprise a processing system 1400 communicatively coupled with the first integrated circuit 420 and the fourth integrated circuit 470 illustrated in FIG. 4. In some embodiments, a processing system 1400 of the first system 200 may perform some of the functions of the first supervisor 430. Similarly, in some embodiments, the second system 210 may comprise a processing system 1400 communicatively coupled with the second integrated circuit 440 and the third integrated circuit 490 illustrated in FIG. 4. In some embodiments, a processing system 1400 of the second system 210 may perform some of the functions of the second supervisor 435. Referring to FIG. 10, a processing system 1400 may include a microprocessor 1414, a memory unit 1412, and/or a user interface 1418 configured to perform data communication using a bus 1420. The microprocessor 1414 may include a CPU or an AP. The processing system 1400 may further include a RAM 1416 in direct communication with the microprocessor 1414. The microprocessor 1414 and/or the RAM 1416 may be assembled within a single package. The user interface 1418 may be used to input data to the electronic system 1400, or output data from the electronic system 1400. For example, the user interface 1418 may include a touch pad, a touch screen, a keyboard, a mouse, a voice detector, a cathode ray tube (CRT) monitor, an LCD, an AMOLED, a plasma display pad (PDP), a printer, a lighting, or various input/output devices. The memory unit 1412 may store operational codes of the microprocessor 1414, data processed by the microprocessor 1414, or data received from the outside. The memory unit 1412 may include a memory controller, a hard disk, or a solid state drive (SSD). The microprocessor 1414, the RAM 1416, and/or the memory unit 1412 may include semiconductor devices in accordance with the present inventive concepts.

In the above-description of various embodiments of the present inventive concepts, it is to be understood that the terminology used herein is for the purpose of describing particular embodiments only and is not intended to be limiting of the inventive concepts. Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of this specification and the relevant art and will not be interpreted in an idealized or overly formal sense expressly so defined herein.

When an element is referred to as being "connected," "coupled," "responsive," or variants thereof to another element, it can be directly connected, coupled, or responsive to the other element or intervening element may be present. In contrast, when an element is referred to as being "directly connected," "directly coupled," "directly responsive," or variants thereof to another element, there are no intervening elements present. Like numbers refer to like elements throughout. Furthermore, "coupled," "connected," "responsive," or variants thereof as used herein may include wirelessly coupled, connected, or responsive. As used herein, the singular forms "a," "an," and "the" are intended to include the plural forms as well, unless the context clearly indicates otherwise. Well-known functions or constructions may not be described in detail for brevity and/or clarity. The term "and/or" includes any and all combinations of one or more of the associated listed items.

As used herein, the terms "comprise," "comprising," "comprises," "include," "including," "includes," "have," "has," "having," or variants thereof are open-ended, and include one or more stated features, integers, nodes, steps, components or functions but does not preclude the presence or addition of one or more other features, integers, nodes, steps, components, functions or groups thereof. Furthermore, as used herein, the common abbreviation "e.g.," which derives from the Latin phrase "exempli gratia," may be used to introduce or specify a general example or examples of a previously mentioned item, and is not intended to be limiting of such item. The common abbreviation "i.e.," which derives from the Latin phrase "id est," may be used to specify a particular item from a more general recitation.

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computer environment or offered as a service such as a Software as a Service (SaaS).

These computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/BlueRay).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks. Accordingly, embodiments of the present inventive concepts may be embodied in hardware and/or in software (including firmware, resident software, micro-code, etc.) that runs on a processor such as a digital signal processor, which may collectively be referred to as "circuitry," "a module," or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated. Moreover, although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of various example combinations and subcombinations of embodiments and of the manner and process of making and using them, and shall support claims to any such combination or subcombination.

Many variations and modifications can be made to the embodiments without substantially departing from the principles of the present inventive concepts. All such variations and modifications are intended to be included herein within the scope of the present inventive concepts.

In the drawings and specification, there have been disclosed typical embodiments and, although specific terms are employed, they are used in a generic and descriptive sense only and not for purposes of limitation, the scope of the disclosure being set forth in the following claims.

What is claimed is:

1. A method of synchronizing operations between integrated circuits, comprising:
    transmitting a first periodic reference signal from a first transmitter associated with a first integrated circuit of a first system, to a receiver associated with a second integrated circuit of a second system;
    receiving a second periodic reference signal from a second transmitter associated with a third integrated circuit of the second system;
    receiving at the first system a first phase difference determined by the second system, wherein the first phase difference is determined between the first periodic reference signal at the second system and the second periodic reference signal at the second system;
    determining a second phase difference at the first system, wherein the second phase difference is determined between the first periodic reference signal at the first system and the second periodic reference signal at the first system; and
    determining a difference between the first phase difference and the second phase difference.

2. The method of claim 1, further comprising:
    transmitting a first phase marker associated with a first clock signal as the first periodic reference signal from the first transmitter to the receiver,
    wherein the first phase marker is configured to be used by the second system to adjust an output of the second integrated circuit to be time-aligned with the first phase marker; and
    receiving a second phase marker associated with a second clock signal as the second periodic reference signal from the second transmitter,
    wherein the second phase marker is configured to be used by the first system to adjust an output of a fourth integrated circuit of the first system to be time-aligned with the second phase marker.

3. The method of claim 2, wherein the first integrated circuit is a first digital phase-locked loop (DPLL), the second integrated circuit is a second DPLL, the third integrated circuit is a third DPLL, and the fourth integrated circuit is a fourth DPLL.

4. The method of claim 2, wherein transmitting the first phase marker associated with the first clock signal comprises transmitting the first phase marker as a first data transmission within the first clock signal.

5. The method of claim 4, wherein the first data transmission within the first clock signal is transmitted by pulse width modulating the first clock signal without altering the frequency of a first repeating edge of the first clock signal.

6. The method of claim 5, wherein receiving at the first system the first phase difference determined by the second system comprises receiving the first phase difference as a second data transmission within the second clock signal.

7. The method of claim 6, wherein the second data transmission within the second clock signal is received by decoding a pulse width modulation of the second clock signal, and
    wherein the frequency of a second repeating edge of the second clock signal is constant.

8. The method of claim 1, wherein the first periodic reference signal is a first clock signal with a first frequency, and wherein the second periodic reference signal is a second clock signal with a second frequency different from the first frequency.

9. The method of claim 1, further comprising determining a transmission delay between the first system and the second system based on the difference between the first phase difference and the second phase difference.

10. The method of claim 9, further comprising transmitting the transmission delay to the receiver.

11. An integrated circuit of a first system, comprising:
a first phase-locked loop (PLL);
a second PLL;
a transmitter associated with the first PLL and configured to transmit a first periodic reference signal to a second system;
a receiver associated with the second PLL and configured to receive a second periodic reference signal from the second system; and
a processing circuit performing operations comprising:
transmitting the first periodic reference signal from the transmitter to the second system;
receiving the second periodic reference signal at the receiver,
receiving at the receiver a first phase difference determined by the second system between the first periodic reference signal at the second system and the second periodic reference signal at the second system;
determining a second phase difference between the first periodic reference signal at the first system and the second periodic reference signal at the first system; and
determining a difference between the first phase difference and the second phase difference.

12. The integrated circuit of claim 11, wherein the processing circuit is further configured to perform operations comprising:
transmitting a first phase marker associated with a first clock signal as the first periodic reference signal to the second system from the transmitter,
wherein the first phase marker is configured to be used by the second system to adjust an output of a third PLL of the second system to be time-aligned with the first phase marker; and
receiving a second phase marker associated with a second clock signal as the second periodic reference signal from a fourth PLL of the second system at the receiver,
wherein the second phase marker is configured to be used by the processing circuit to adjust an output of the second PLL to be time-aligned with the second phase marker.

13. The integrated circuit of claim 12, wherein transmitting the first phase marker associated with the first clock signal comprises transmitting the first phase marker as a first data transmission within the first clock signal.

14. The integrated circuit of claim 13, wherein receiving at the receiver the first phase difference comprises receiving the first phase difference as a second data transmission within the second clock signal.

15. The integrated circuit of claim 14, wherein the second data transmission within the second clock signal is received by decoding a pulse width modulation of the second clock signal, and wherein the frequency of a repeating leading edge of the second clock signal is constant.

16. An integrated circuit of a second system, comprising:
a first phase-locked loop (PLL);
a second PLL;
a receiver associated with the first PLL and configured to receive a first periodic reference signal from a first system;
a transmitter associated with the second PLL and configured to transmit a second periodic reference signal to the first system; and
a processing circuit configured to perform operations comprising:
receiving the first periodic reference signal at the receiver;
transmitting the second periodic reference signal from the transmitter to the first system;
determining a first phase difference between the first periodic reference signal at the receiver and the second periodic reference signal at the transmitter;
transmitting the first phase difference to the first system; and
receiving a transmission delay calculation at the receiver from the first system that is based on a difference between the first phase difference and a second phase difference determined by the first system.

17. The integrated circuit of claim 16, wherein the first periodic reference signal is a first clock signal and the second periodic reference signal is a second clock signal.

18. The integrated circuit of claim 16, wherein the processing circuit is further configured to perform operations comprising:
receiving a first phase marker associated with a first clock signal as the first periodic reference signal at the receiver,
wherein the first phase marker is configured to be used to adjust an output of the first PLL to be time-aligned with the first phase marker; and
transmitting a second phase marker associated with a second clock signal as the second periodic reference signal from the transmitter to the first system,
wherein the second phase marker is configured to be used by the first system to adjust an output of a third PLL of the first system to be time-aligned with the second phase marker.

19. The integrated circuit of claim 18, wherein receiving the first phase marker associated with the first clock signal comprises receiving the first phase marker as a first data transmission within the second clock signal.

20. The integrated circuit of claim 19, wherein transmitting the first phase difference to the first system comprises transmitting the first phase difference as a second data transmission within the second clock signal.

* * * * *